(12) United States Patent
Roeder et al.

(10) Patent No.: US 7,485,611 B2
(45) Date of Patent: Feb. 3, 2009

(54) SUPERCRITICAL FLUID-BASED CLEANING COMPOSITIONS AND METHODS

(75) Inventors: Jeffrey F. Roeder, Brookfield, CT (US); Thomas H. Baum, New Fairfield, CT (US); Matthew Healy, Norwalk, CT (US); Chongying Xu, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 139 days.

(21) Appl. No.: 10/249,763

(22) Filed: May 6, 2003

(65) Prior Publication Data

US 2004/0224865 A1 Nov. 11, 2004
US 2007/0149429 A9 Jun. 28, 2007

Related U.S. Application Data

(63) Continuation-in-part of application No. 10/285,146, filed on Oct. 31, 2002, now Pat. No. 6,989,358.

(51) Int. Cl.
H01L 21/302 (2006.01)
(52) U.S. Cl. ......................................... 510/175; 134/36
(58) Field of Classification Search ................. 510/407, 510/175, 176; 134/1, 3, 2, 10, 902, 36; 437/209; 228/180.22; 8/142; 438/692, 693, 906; B08B 3/00
See application file for complete search history.

(56) References Cited

U.S. PATENT DOCUMENTS

| | | | |
|---|---|---|---|
| 5,730,874 A | 3/1998 | Wai et al. | |
| 5,866,005 A | 2/1999 | DeSimone et al. | |
| 5,868,856 A | 2/1999 | Douglas et al. | |
| 5,868,862 A | 2/1999 | Douglas et al. | |
| 5,944,996 A | 8/1999 | DeSimone et al. | |
| 5,965,025 A | 10/1999 | Wai et al. | |
| 6,187,911 B1 | 2/2001 | Wai et al. | |
| 6,242,165 B1 | 6/2001 | Vaartstra | |
| 6,270,531 B1 | 8/2001 | DeYoung et al. | |
| 6,306,564 B1 | 10/2001 | Mullee | |
| 6,309,425 B1 * | 10/2001 | Murphy | 8/142 |
| 6,331,487 B2 | 12/2001 | Koch | |
| 6,398,875 B1 * | 6/2002 | Cotte et al. | 134/2 |
| 6,500,605 B1 | 12/2002 | Mullee et al. | |
| 6,509,141 B2 | 1/2003 | Mullee | |
| 6,521,466 B1 | 2/2003 | Castrucci | |
| 6,562,146 B1 | 5/2003 | DeYoung et al. | |
| 6,596,093 B2 * | 7/2003 | DeYoung et al. | 134/36 |
| 6,602,349 B2 | 8/2003 | Chandra et al. | |
| 6,669,785 B2 | 12/2003 | DeYoung et al. | |
| 6,743,078 B2 | 6/2004 | McClain et al. | |
| 6,756,084 B2 * | 6/2004 | Fulton et al. | 427/458 |
| 6,764,552 B1 * | 7/2004 | Joyce et al. | 134/3 |

(Continued)

*Primary Examiner*—Gregory E Webb
(74) *Attorney, Agent, or Firm*—Chih-Sheng Lin; Tristan A. Fuierer; Moore & Van Allen, PLLC (57) ABSTRACT

Compositions and methods employing supercritical fluids, e.g., supercritical carbon dioxide, for removal of unwanted material from microelectronic device structures and process equipment. One composition of such type, having utility for removing flux and solder perform surface films, includes supercritical fluid, e.g., supercritical $CO_2$, and organic co-solvent, e.g., xylene. Another composition of such type having utility for removal of metals, metal oxides, metal-containing post-etch residues and CMP particles from semiconductor substrates includes supercritical fluid and at least one β-diketone.

68 Claims, 1 Drawing Sheet

U.S. PATENT DOCUMENTS

| | | |
|---|---|---|
| 6,770,426 B1 | 8/2004 | Vaartstra |
| 6,782,900 B2 | 8/2004 | DeYoung et al. |
| 6,858,089 B2 | 2/2005 | Castrucci |
| 6,871,656 B2 | 3/2005 | Mullee |
| 2002/0023305 A1* | 2/2002 | Murphy .......................... 8/142 |
| 2002/0164873 A1 | 11/2002 | Masuda et al. |
| 2003/0008155 A1* | 1/2003 | Hayashi et al. ............. 428/447 |
| 2003/0196679 A1* | 10/2003 | Cotte et al. .................... 134/1 |
| 2004/0087174 A1* | 5/2004 | Korzenski et al. ........... 438/745 |
| 2004/0087457 A1* | 5/2004 | Korzenski et al. ........... 510/177 |
| 2004/0175948 A1 | 9/2004 | DeSimone et al. |
| 2004/0216772 A1* | 11/2004 | Xu et al. ....................... 134/36 |

* cited by examiner

SUPERCRITICAL FLUID-BASED CLEANING COMPOSITIONS AND METHODS

CROSS REFERENCE TO RELATED APPLICATIONS

This application is a Continuation-in-Part of U.S. application Ser. No. 10/285,146 filed on Oct. 31, 2002 now U.S. Pat. No. 6,989,358, titled "SUPERCRITICAL CARBON DIOXIDE/CHEMICAL FORMULATION FOR REMOVAL OF PHOTORESISTS" by Michael B Korzenski, et al., now U.S. Pat. No. 6,989,358.

BACKGROUND OF INVENTION

1. Field of the Invention

The present invention relates to supercritical fluid-based compositions and methods useful in semiconductor manufacturing for the removal of unwanted material from semiconductor manufacturing equipment as well as semiconductor substrates and device structures.

2. Description of the Related Art

In the field of semiconductor manufacturing, many different types of cleaning reagents are utilized for removing unwanted material from process chambers as well as substrates and microelectronic device structures. Examples include removal of flux employed in connection with bonding of integrated circuitry devices and packages, cleaning of chemical reservoirs for use in deposition operations, and cleaning of substrates and device structures to remove post-etch, lithographic resist residue, and removal of chemical mechanical planerization slurry particulates in deep trench, high aspect ratio structures.

Each of these semiconductor manufacturing cleaning operations is further discussed below.

In the fabrication of integrated circuit packages, and the manufacture of microelectronic components generally, fluxes frequently are employed to join electronic components by soldering processes. The function of the flux includes thermally-activated removal of surface oxide films (e.g., surface oxides of metals such as copper, nickel, gold-coated copper and gold-coated nickel) from surfaces to be joined, as well as removal of oxides from the solder, particularly when the solder is in a pre-form state. Solder bumps are a widely used type of pre-form solder, and are pervasively used in semiconductor manufacturing bonding operations, e.g., for chip-to-chip and chip-to-package interconnect structures. Although fluxless methods of joining components have been developed, fluxes continue to be widely used, due in no small part to their ability to function as a temporary adhesive to fix a chip in place prior to the reflow (solder bonding) process.

Numerous varieties of fluxes are in common use. Many of such fluxes are rosin-based, and many fluxes contain halogens, e.g., chlorine. When these type of fluxes are employed, residual flux must be removed after joining, in order to prevent corrosion resulting from the oxidation-promoting component(s) of the flux composition, as well as to allow effective encapsulation to be performed, when encapsulation is carried out in connection with the joining process.

As integrated circuitry continues to densify, the use of flip-chip solder bonding has increased. In flip-chip bonding, the use of the flip-chip flux as a temporary adhesive is important in preserving alignment of the chip interconnect with the package pads between the placement and reflow steps.

A significant problem with flip-chip bonding is the need to remove all residual flux from the space between the chip and the package, with the difficulty being attributable to the relatively narrow separation of the chip and package, as well as the proximity of the solder balls to each other (in the array of solder bumps that is typically employed for the bonding operation). This proximity prevents good circulation and removal of conventional cleaning media, such as polar organic solvents, used for removing the residual flux.

As another cleaning operation commonly employed in semiconductor processing, chemical reservoirs are conventionally cleaned between successive charges. Chemical reservoirs are utilized in a variety of unit operations in the manufacture of microelectronic devices and thin film structures. Such chemical reservoirs must be completely cleaned and dried prior to each use, in order to maintain the high-purity character of the reagent that is held in and dispensed from the reservoir in subsequent operation. Conventional reservoir cleaning processes employed in the industry frequently include the following steps: (1) rinsing of the chamber with copious amounts of organic solvents to solubilize and remove residual chemical remaining from prior precursor charging of the reservoir, (2) washing of the reservoir with acids to remove acid-reactive residues and produce an uncontaminated reservoir surface for holding chemical in subsequent active operations, (3) thorough rinsing with copious amounts of de-ionized water to remove the acids and other residues in the reservoir, (4) rinsing of the reservoir with dry (anhydrous) organic solvents, e.g., isopropanol, acetone, and the like, to remove any residue not removed in the prior water rinsing step, and (5) drying of the reservoir.

Such cleaning processes employ large amounts of organic solvents, producing substantial volumes of organic waste and increasing the cost of the process, due to the necessity of solvent abatement and reclamation operations, to comply with applicable environmental and safety regulations. These conventional cleaning processes also have an associated deficiency when aqueous rinsing is employed, since any adsorbed water can be difficult to remove from the reservoir. If remaining in the reservoir as a residue, such adsorbed water can cause degradation of chemical reagents, when the reservoir is refilled with the chemical reagent and returned to active processing service. The degradation of the chemical reagent in turn may result in the manufactured semiconductor product being deficient or even useless for its intended purpose.

The above-discussed problems incident to conventional flux cleaning and reservoir cleaning operations are also present in various respects in the cleaning of microelectronic substrates and device thin film structures, as conventionally carried out to remove residues and extraneous material from the microelectronic device or precursor structure during its fabrication. Currently, many integrated circuitry manufacturing processes require aqueous-based cleaning, e.g., for removal of lithographic resist residues after etch removal of the resist. Although these cleaning processes are extremely well-developed and widely implemented in semiconductor manufacturing operations, such processes are substantially less useful and effective in application to high-aspect ratio vias and other finely-dimensioned features. This deficiency is due primarily to the high surface tension of aqueous solutions used for cleaning of structures having critical dimensions less than 0.1 micron. In such application, capillarity and wetting characteristics of the aqueous cleaning composition prevent penetration of the sub-micron structures, with the result that contaminants and extraneous materials are not removed from the finely-dimensioned features of the microelectronic device.

Further, in application to cleaning of low dielectric constant materials such as copper-porous low k multi-layer structures, special non-aqueous processing may be required to eliminate moisture uptake of porous low k dielectrics from the aqueous cleaning composition, in order to maintain suitable k values. Additionally, the dielectric constant of low k materials is critical and aqueous contamination can negatively increase dielectric constants and reliability of such materials.

For all of the foregoing reasons, the semiconductor manufacturing industry is in continuing need of improved cleaning reagents and methods to overcome the above-discussed problems associated with conventional cleaning techniques and materials.

SUMMARY OF INVENTION

The present invention relates to supercritical fluid cleaning compositions and methods useful in semiconductor manufacturing.

In one aspect, the invention relates to cleaning compositions useful for removing unwanted solder flux material and surface films from integrated circuitry structures and solder preforms having such unwanted material thereon, said cleaning formulation comprising a supercritical fluid, a co-solvent, and chemical additives, as needed.

Another aspect of the invention relates to a cleaning composition useful for removal of metals, metal oxides, metal-containing post-etch residues, and CMP particles, such composition comprising a supercritical fluid, a co-solvent, and chemical additives such as chelators and/or surfactants.

A further aspect of the invention relates to a method of removing unwanted solder flux material and surface films from integrated circuitry structures and solder preforms having the unwanted material thereon, such method comprising contacting the unwanted material with a cleaning formulation comprising a supercritical fluid, a co-solvent, and chemical additives.

In another aspect, the invention relates to a method for cleaning a chemical reservoir, comprising contacting said chemical reservoir with a cleaning composition comprising a supercritical fluid and a co-solvent.

Yet another aspect of the invention relates to a method of making a packaged integrated circuit (IC) product, comprising fabricating an IC chip, affixing the IC chip to packaging structure with an array of solder preform balls in contact with a flux, applying heat to the array of solder perform balls to effect solder bonding of the IC chip to the packaging structure, and cleaning solder-bonded regions by contacting same with a cleaning composition comprising supercritical fluid, a co-solvent, and chemical additives, including chelators and/or surfactants.

A still further aspect of the invention relates to a method of cleaning a semiconductor substrate for removal of unwanted material thereon, wherein said unwanted material comprises material selected from the group consisting of metals, metal oxides, metal-containing post-etch residues, and CMP particles, said method comprising contacting the semiconductor substrate with a cleaning composition comprising a supercritical fluid and at least one β-diketone.

Other aspects, features and embodiments of the invention will be more fully apparent from the ensuing enclosure and appended claims.

DETAILED DESCRIPTION

The present invention is based on the discovery of compositions and methods employing supercritical fluids, e.g., supercritical carbon dioxide, for removal of unwanted material from microelectronic device structures and process equipment.

Supercritical fluids such as supercritical carbon dioxide (SCCO2) might at first glance be regarded as attractive reagents for cleaning applications in semiconductor manufacturing, since supercritical fluids have the characteristics of both liquids as well as gases. Like a gas, the supercritical fluid diffuses rapidly, has low viscosity and near-zero surface tension, and penetrates easily into deep trenches and vias. Like a liquid, the supercritical fluid has bulk flow capability as a "wash" medium.

Despite these ostensible advantages, however, SCCO2 and other commonly employed supercritical fluid species are non-polar. Accordingly, they are not useful to solubilize polar species such as inorganic salts and polar organic compounds that are present in photoresists and chemical reagents and that must be removed from the semiconductor substrate or chemical reagent reservoir for efficient cleaning. The non-polar character of SCCO2 and other common supercritical fluid species has therefore been an impediment to the use of supercritical fluids in applications such as photoresist removal subsequent to deposition of photoresist on the microelectronic device substrate.

In addition, supercritical fluids have not been considered for cleaning of chemical precursor ampoules or reservoirs in semiconductor processing operations, due to the well-entrenched character of conventional cleaning processes. Despite the fact that these conventional cleaning processes require large volumes of water and organic solvents, they have been found to be generally effective. As a result, the semiconductor industry has persisted in using such conventional cleaning processes.

As an additional factor, supercritical fluids are susceptible to the perception (even apart from issues attributable to their non-polar character) that their solvation and penetrating power, while seemingly advantageous on initial consideration, may in fact be a significant disadvantage, by causing contaminants and extraneous material removed in the supercritical fluid to be re-deposited from the supercritical fluid in the innermost interstices and micromorphological defects of the structure (hardware) being cleaned.

The present invention, however, is based on the discovery that disadvantages associated with non-polarity of SCCO2 and other supercritical fluids can be overcome, by appropriate formulation of the supercritical fluid-based cleaning composition with additives as hereinafter more fully described, and the accompanying discovery that cleaning of chemical reagent reservoirs with a supercritical fluid-based cleaning medium is highly effective and without detrimental side effects as regards the efficiency and extent of the cleaning operation.

While the invention in respect of the supercritical fluid is hereinafter described primarily with reference to carbon dioxide as the supercritical fluid, the utility of the present invention is not thus limited, and the invention can be practiced using any other supercritical fluid species, e.g., oxygen, argon, krypton, xenon, water, ammonia, etc., as well as mixtures of two or more supercritical fluid species having compatible supercritical phase conditions.

In one aspect, the invention relates to a supercritical fluid-based cleaning composition useful in removing surface oxide films (flux residue) from surfaces of semiconductor components to be joined by solder bonding, as well as for removing surface films from the solder itself when the solder is in a pre-form state such as a solder bump (solder ball). Such flux/solder cleaning composition comprises (i) a supercritical fluid, e.g., a supercritical fluid species such as carbon dioxide, oxygen, argon, krypton, xenon, water or ammonia, or a mixture of two or more of such supercritical fluid species, (ii) a co-solvent and (iii) chemical additives to further enhance or effect the cleaning process.

The co-solvent comprises an organic solvent species which in relation to use of the supercritical fluid alone enhances the ability of the supercritical fluid-based composition to remove flux or other unwanted film material from a semiconductor device structure or solder pre-form article. The co-solvent may also aid in the removal of the chemical additives, so that the chemical additives in the cleaning composition do not themselves become contaminants.

The co-solvent can be of any suitable type. For example, the co-solvent can be an organic solvent or a mixture of organic species. The co-solvent can alternatively be a solution of organic solvent(s) with inorganic and/or organic additives. Illustrative organics for co-solvent species include, but are not limited to, xylene, methanol, ethanol, and higher alcohols, acetone, methyl ethyl ketone, N-alkylpyrrolidiones, such as N-methyl-, N-octyl-, or N-phenyl-pyrrolidiones, dimethylsulfoxide, sulfolane, catechol, ethyl lactate, acetone, butyl carbitol, monoethanolamine, butyrol lactone, diglycol amine, Γ-butyrolactone, butylene carbonate, ethylene carbonate, propylene carbonate, beta-diketones and carboxylic acids. The organic and/or inorganic additives include, but are not limited to, surfactants, such as surfynol, and fluorinated surfactants, ammonium fluoride ($NH_4F$), ammonium fluoride derivatives of the formula $NR_4F$ where each R is independently selected from hydrogen and $C_1$-$C_8$ alkyl, carboxylic acids, $CF_3SO_3F$, boric acid, and aryl sulfonic acids.

The co-solvent species can be a single component co-solvent or a mixture of two or more co-solvent species. Such co-solvent component(s) can be present in the supercritical fluid-based cleaning composition at any suitable concentration, consistent with solubility of the co-solvent species in the supercritical fluid.

As an illustrative example, the co-solvent can be xylene that is present in the SCCO2 supercritical fluid to a concentration of about 5 percent by volume, based on the total volume of the carbon dioxide supercritical fluid and the co-solvent species. This specific cleaning composition has particular utility for flux cleaning.

In one embodiment of the invention, depending on the co-solvent species, the co-solvent can be present in the cleaning composition at concentrations of from about 0.1 percent to about 25 percent by volume, or more, depending on the solubility limit of the co-solvent in the specific supercritical fluid employed. More preferably, the co-solvent is present in the cleaning composition at concentrations of from about 0.1 percent to about 15 percent by volume, based on the total volume of the composition (the supercritical fluid, the co-solvent species, and any chemical additives utilized in the composition).

By inclusion of a co-solvent species in the cleaning composition for flux and solder pre-form cleaning, the extremely low surface tension of the supercritical fluid permits highly effective penetration of the cleaning composition into the cavity separating the integrated circuit chip and substrate, so that the cleaning composition is brought into extensive contact with all surfaces. The cleaning composition is correspondingly able to wet the base of solder balls when solder balls are the joining medium employed to bond the chip to the substrate package article, thereby providing a dramatic improvement over conventional flux and solder cleaning processes in instances where the size of the solder balls produces an acute angle between the solder ball surface and the adjacent surface that precludes the use of the solvent-based cleaning compositions of the prior art.

The ability to achieve superior wetting of the solder bonding locus by a cleaning composition containing supercritical fluid, correspondingly permits the amount of organic solvents to be minimized as compared to solvent cleaning methods of the prior art.

As a result, the amount of solvent species employed in the cleaning operation is very substantially reduced in the cleaning processes of the present invention, relative to those of the prior art. In such manner, the compositions and cleaning methods of the present invention dramatically improve overall process economics of the semiconductor manufacturing operations in which they are employed, and minimize environmental impact of the cleaning composition.

Further, supercritical fluids have been discovered to possess excellent drying properties, and post-cleaning residues therefore are minimized relative to solvent-based cleaning processes of the prior art, particularly when multiple cleaning cycles are employed or chemical additives are used in the cleaning composition.

Figure 1:
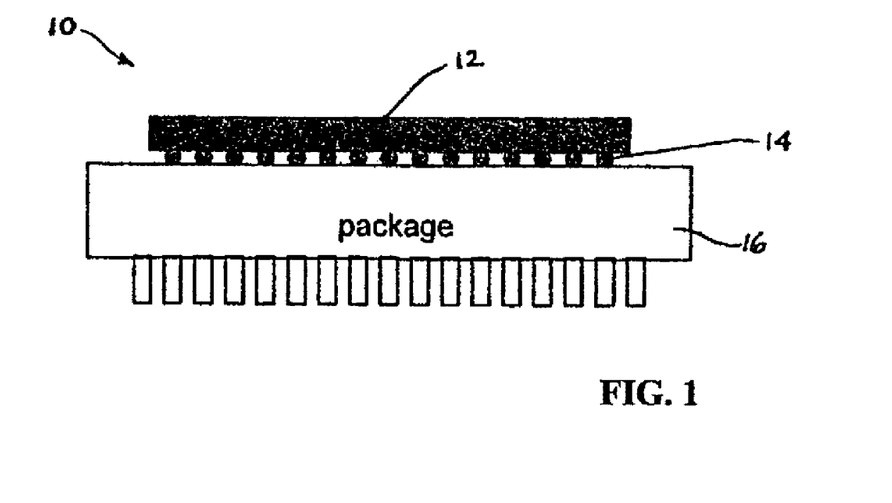
FIG. 1 is a front elevation view of an integrated circuit package assembly, showing the integrated circuit chip, and associated solder balls for bonding of the chip to the package structure.
Figure 2:
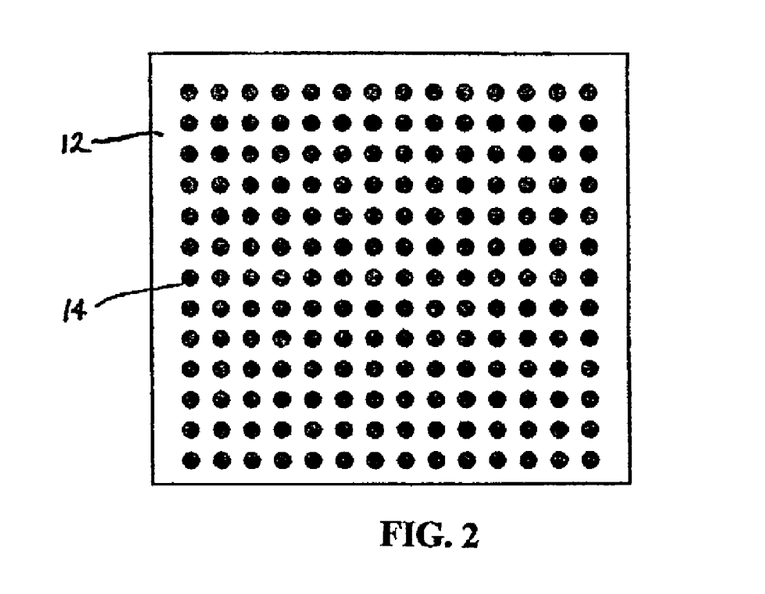
FIG. 2 is a bottom plan view of the integrated circuit chip of FIG. 1, showing the array of solder balls on the bottom surface of the chip, as employed to bond the chip to the package structure.

FIG. 1 and FIG. 2 show respective front elevation and bottom plan views of an integrated circuit module 10 including an integrated circuit chip 12 featuring an array of solder balls 14 on the underside of the chip, for bonding of the chip to an associated package 16. In conventional practice, hundreds and even thousands of solder balls 14 can be present in the interconnect array for a single chip. Typical dimensions of the solder balls 14 range from about 10 to about 100 micrometers. The solder balls of such size typically are disposed in an array at a pitch of approximately twice the ball diameter, leaving a gap between successive balls as well as a gap between the chip and substrate that are dimensionally similar to the size of the solder balls themselves.

Supercritical fluid-based cleaning compositions for cleaning of flux and solder in accordance with the invention, are usefully employed at any suitable process conditions, with respect to contacting of the cleaning composition with the flux or solder. Illustrative process conditions for the SCCO2/xylene composition previously described, wherein xylene is present in a concentration of 5 percent by volume, based on the total volume of the supercritical fluid and co-solvent, include temperature in a range of from about 31° C. to about 120° C. and pressure in a range of from about 73 to about 500 atmospheres.

In addition to the supercritical fluid and co-solvent, flux/solder cleaning compositions of the invention can include other components, as necessary or desirable in a given use application.

For example, the cleaning composition may include chemical additives, such as for example, and without limitation, active agent(s), surfactant(s) and/or chelating agent(s), as appropriate.

As used in such context, an "active agent" is a material that induces chemical reaction in the bulk volume of the cleaning composition, and/or at the surface of the semiconductor device structure or flux/solder material, to enhance the cleaning and/or removal action of the composition, relative to a corresponding cleaning composition lacking such active agent(s).

Examples of active agents include, without limitation, acids, bases, reducing agents, oxidizing agents and metal chelators.

When a reducing agent is solubilized in the supercritical fluid, the reducing agent may require activation, e.g., by an activation process involving thermal, optical, and/or sonic activation.

Surfactants useful in the cleaning compositions of the present invention can be of any suitable type, including anionic, neutral, cationic, and zwitterionic types. Illustrative surfactant species include, without limitation, acetylenic alcohols and diols, and long alkyl chain secondary and tertiary amines. Specific surfactant examples include 3,4-dimethyl-1-hexyn-3-ol and 2,4,7,9-tetramethyl-5-decyn-4,7-diol. Fluorinated surfactants are also advantageously employed surfactant species in various embodiments of the invention.

Chelating agents useful in the cleaning compositions of the invention can be of any suitable type, including, for example: carboxylic acids such as acetic acid, trifluoroacetic acid, polycarboxylic acids such as iminodiacetic acid and lauryl ethylenediamine triacetic acid; β-diketones such as: 2,4-pentanedione; 1,1,1-trifluoro-2,4-pentanedione; and 1,1,1,5,5,5-hexafluoro-2,4-pentanedione; substituted dithiocarbamates; malonic acid esters; and polyethylene glycols.

Illustrative species of acids useful in cleaning compositions of the invention include, without limitation, acetic acids, perfluorocarboxylic acids, and alkyl or aryl sulfonic acids.

Illustrative species of bases useful in cleaning compositions of the invention include, but are not limited to, amines, such as alkyl amines, dialkylamines wherein each of the alkyl moieties is independently selected from $C_1$-$C_8$ alkyl, and ethanolamines.

Oxidizing agents useful in the broad practice of the invention include, without limitation, oxygen, sulfur oxide ($SO_3$), ozone and nitrogen oxides (e.g., NO, $NO_2$).

Reducing agents usefully employed in the cleaning compositions of the invention include, without limitation, hydrogen, aldehydes, alcohols, ammonia, silanes, hydrides and alkyl-substituted hydrazines whose alkyl moiety is selected from $C_1$-$C_8$ alkyl.

The contacting of the flux/solder locus with the cleaning composition is carried out for a suitable period of time, which in a specific embodiment can for example be on the order of from about 20 to about 60 seconds, although other (longer or shorter) periods of contacting can be usefully employed, depending on the nature and amount of the material to be removed from the semiconductor structure or solder preform, and the process conditions that are employed for cleaning.

The cleaning of the flux/solder locus can be carried out with the semiconductor article disposed in a contacting chamber, through which the supercritical fluid cleaning composition is flowed at a desired flow rate effective to remove the flux residue, solder surface deposits and/or any other contaminants or extraneous material that is desired to be removed. Following the cleaning, which may be carried out in multiple contacting steps, or in a continuous or batch contacting mode of operation, the supply of the cleaning composition to the contacting chamber is terminated. The contacting chamber then can be rapidly decompressed to separate the supercritical fluid composition from the article, viz., by gasification and exhaust of the regasified supercritical fluid from the contacting chamber, with the non-supercritical component(s) being entrained in the regasified supercritical fluid so that they are likewise removed from the contacting chamber.

The aforementioned decompression step may be conducted for a suitable period of time, e.g., on the order of 5-20 seconds, although longer or shorter times may be desirable depending on the character of the material to be removed from the semiconductor article and the process conditions of the cleaning process.

If necessary, repeated cycles of contacting and decompression may be utilized, to achieve substantially complete removal of the unwanted material from the semiconductor product article.

The present invention in another aspect contemplates the use of supercritical fluid-based cleaning compositions for cleaning of chemical reservoirs that are used in semiconductor manufacturing plants.

As mentioned in the Background of the Invention section hereof, conventional cleaning processes involve organic solvent contacting steps, acid washes, deionized water rinsing steps, organic solvent rinse steps, and drying steps. Such conventional cleaning processes thus involve high-volume consumption of organic solvents by the semiconductor manufacturing facility.

In accordance with a further aspect of the invention, chemical reservoirs of a semiconductor manufacturing facility are cleaned using supercritical fluid-based cleaning compositions.

Such cleaning compositions can include the supercritical fluid in neat form, or alternatively the cleaning compositions be formulated to include other components that are compatible with the supercritical cleaning fluid, such as those discussed hereinabove in connection with flux/solder cleaning compositions, viz., co-solvent (s), active agent(s), surfactant(s) and/or chelating agent(s), as appropriate.

The advantages of using supercritical fluid-based cleaning compositions for chemical reservoir cleaning in accordance with the present invention are numerous. They include substantial reduction of cleaning costs and of amounts of waste that are generated. The supercritical fluid used in such compositions can be of any suitable type. SCCO2 is a preferred supercritical fluid species for such purpose. SCCO2 is readily commercially available, environmentally benign, and recyclable, enabling a cleaning process to be employed that is environmentally attractive and that significantly reduces waste generation and cost of ownership in the semiconductor manufacturing facility.

Supercritical fluid-based cleaning compositions in accordance with the invention, in application to chemical reservoir cleaning, also achieve a substantial reduction of water and moisture contamination in the cleaning process, in relation to aqueous cleaning techniques of the prior art.

In conventional cleaning processes utilizing aqueous cleaning media, if chemical reservoirs are not completely dried, trace amounts of water can persist. This circumstance in turn can entail potentially catastrophic consequences, since water contamination can alter the chemistry of the chemical that is contained in the reservoir during active semiconductor manufacturing operations. This alteration of chemistry incident to water contamination can ultimately render semiconductor products manufactured with the water-contaminated chemical deficient, or even useless, for their intended purpose.

Contrariwise, the use of a supercritical fluid cleaning composition, in accordance with the present invention, eliminates the use of aqueous acid solutions and water rinsing steps, and thereby avoids water contamination problems associated with prior art aqueous cleaning techniques.

In the preferred practice of utilizing supercritical fluid-based cleaning compositions to clean chemical reservoirs, a step of pressure reduction is advantageously utilized at the conclusion of the cleaning process, to discharge cleaning fluid from the reservoir. For example, utilizing a cleaning composition containing SCCO2 as the supercritical fluid, pressure can be selectively reduced at the conclusion of the cleaning operation, to thereby gasify the SCCO2 to form CO gas. The resulting $CO_2$ gas then is discharged from the cleaning chamber, leaving no residues or moisture behind. In this manner, use of a supercritical fluid cleaning composition, in accordance with the present invention, avoids the occurrence of problems attributable to water contamination of the chemical reservoir, such as are widely experienced in semiconductor manufacturing plants using conventional aqueous-based cleaning methods.

The use of supercritical fluid-based cleaning compositions in accordance with the present invention, for cleaning of chemical reservoirs, also permits processing time to be substantially reduced in the cleaning operation. In conventional chemical reservoir cleaning methods, the reservoir must be dried in an oven or other elevated temperature environment, for a sufficiently long period of time to ensure complete removal of water. The supercritical fluid-based cleaning method of the present invention avoids the necessity of such drying operations, and thereby achieves a substantial simplification of the cleaning process.

The chemical reservoir cleaning compositions of the present invention can be formulated in any suitable manner, e.g., by blending or compounding of ingredients, as necessary or desirable in a given end use application.

In one preferred embodiment, the chemical reservoir cleaning composition is formulated with one or more acidic additives. The acidic additives react with solid deposits to form reaction product species that are soluble in the supercritical fluid and thereby are removed from the surfaces of the chemical reservoir. These solid deposits can be inorganic solids that are deposited in the reservoir as a result of degradation of the chemical reagent that is held in the reservoir during normal operation, e.g., organometallic precursors that are utilized for deposition of metal-containing films in vapor deposition processes.

Acidic additives for such purpose can be of any suitable type, including those illustratively mentioned hereinabove in connection with flux/solder cleaning compositions of the invention. Preferred acidic additives for cleaning of chemical reservoirs used for dispensing organometallic precursors include (hfac)H, fluorinated acetic acids, and the like.

In the chemical reservoir cleaning operation, the supercritical fluid-based cleaning composition is introduced at suitable temperature and pressure to the reservoir. The cleaning composition can be flowed through the reservoir to carry out cleaning in a manner that maximizes the mass transfer driving force for uptake of contaminates in the supercritical fluid medium. Alternatively, the chemical reservoir can simply be filled with the supercritical fluid-based cleaning composition, and the cleaning composition then allowed to remain in the vessel for sufficient time to remove unwanted material residues from the reservoir.

In one application of such cleaning approach, a tetraethylorthosilicate (TEOS) canister can be cleaned with a supercritical $CO_2$ composition in a high-pressure chamber. The cleaning pressures for such cleaning can be widely varied, and in specific embodiments can for example be in a range of from 73 to 300 atmospheres, at temperatures in a range of from 32° C. to 80° C. The supercritical $CO_2$ composition for such application is advantageously formulated with 0.1% to 20% alcohol, such as ethanol or isopropanol. The canister is first soaked with the SCCO2/alcohol composition for 1 to 5 minutes and then flushed with supercritical $CO_2$ three times, involving exposure to SCCO2 followed by decompression and transition of the $CO_2$ to a non-supercritical gaseous form. After the decompression, the canister is cleaned and dried and ready for use.

The invention in yet another aspect provides supercritical fluid-based cleaning compositions that are useful for cleaning post-etch lithographic resist residues and/or removing chemical mechanical polishing (CMP) particles from deep trench, high-aspect ratio vias.

For such cleaning of semiconductor device structures to remove post-etch residues, metals, metal oxides, and CMP particles, the supercritical fluid-based cleaning composition is advantageously formulated to contain one or more β-diketone additive(s).

The amount of the β-diketone additive(s) employed in such cleaning compositions is an amount that is effective to enhance removal of the unwanted material (metal, metal oxide, metal-containing residue, CMP particles, etc.), relative to the use of a corresponding supercritical fluid composition lacking such β-diketone additive(s).

In the β-diketone-containing supercritical fluid cleaning compositions of the invention, the β-diketone additive can be of any suitable type, and can for example be of a fluorinated, or alternatively a non-fluorinated, character. Illustrative β-diketone additives include, without limitation, the β-diketone species identified in Table 1 below:

TABLE I

| β-diketone | Abbreviation |
| --- | --- |
| 2,2,6,6-tetramethyl-3,5-heptanedione | thd |
| 1,1,1-trifluoro-2,4-pentanedione | tfac |
| 1,1,1,5,5,5-hexafluoro-2,4-pentanedione | hfac |
| 6,6,7,7,8,8,8-heptafluoro-2,2-dimethyl-3,5-octanedione | fod |
| 2,2,7-trimethyl-3,5-octanedione | tod |
| 1,1,1,5,5,6,6,7,7,7-decafluoro-2,4-heptanedione | dfhd |
| 1,1,1-trifluoro-6-methyl-2,4-heptanedione | tfmhd |

The β-diketone additive can be present in the supercritical fluid-based cleaning composition at any suitable concentration, e.g., a concentration from about 0.1 to about 20 percent by volume, based on the total volume of the supercritical fluid and the β-diketone additive(s), and more preferably from about 0.1 to about 12 percent by volume, on the same total volume basis. The β-diketone additive can be a single diketone compound, or alternatively, two or more β-diketone species may be employed, as necessary or desirable in a given application.

By way of illustrative example, a supercritical fluid cleaning composition for removal of metal oxides, metals and metal-containing post-etch residues can be formulated using SCCO2 as the supercritical fluid, and 1,1,1,5,5,5-hexafluoroacetylacetone ((hfac)H) as the β-diketone additive in an amount of 5 percent by volume, based on the total volume of the SCCO2 and (hfac)H components. Such composition is usefully employed to attack $Cu_2O$ and copper-containing post-etch residues, thereby cleaning the surface of the semiconductor article (with surface oxides being preferentially removed by the β-diketone in a highly efficient manner) and simultaneously reducing inter-layer contact resistances as a result of forming fresh copper metallic surfaces in the cleaning operation.

Supercritical fluid-based cleaning compositions formulated with β-diketones can additionally include co-solvent(s), surfactant(s), chelating agent(s) and/or chemical reactant(s), etc., as necessary or desirable in a given application of the invention.

While the invention has been described herein with reference to specific features, aspects and embodiments, it will be recognized that the invention is not thus limited, but rather is susceptible of implementation in numerous other variations, modifications, and alternative embodiments.

Accordingly, the invention is intended to be broadly construed to include all such other variations, modifications and alternative embodiments, within the spirit and scope of the invention as hereafter claimed.

What is claimed is:

1. A cleaning composition comprising supercritical carbon dioxide, an organic co-solvent, and boric acid, wherein said organic co-solvent comprises a solvent selected from the group consisting of: xylene, N-methylpyrrolidone, N-phenylpyrrolidone, dimethylsulfoxide, sulfolane, catechol, ethyl lactate, acetone, methyl ethyl ketone, monoethanolamine, butyrol lactone, diglycol amine, γ-butyrolactone, butylene carbonate, ethylene carbonate, propylene carbonate, beta-diketone, and combinations thereof.

2. The cleaning composition of claim 1, wherein said organic co-solvent may include inorganic or organic additives selected from the group consisting of ammonium fluoride, alkyl ammonium fluoride derivatives of $NR_4F$, where each R is independently selected from hydrogen and $C_1$-$C_8$ alkyl, $CF_3SO_3F$, and aryl sulfonic acids.

3. The cleaning composition of claim 1, further comprising at least one surfactant.

4. The cleaning composition of claim 3, wherein the at least one surfactant comprises a surfactant selected from the group consisting of: 3,4-dimethyl-1-hexyn-3-ol; 2,4,7,9-tetramethyl-5-decyn-4,7-diol; and fluorinated surfactants.

5. The cleaning composition of claim 1, further comprising at least one chelating agent.

6. The cleaning composition of claim 5, wherein the at least one chelating agent comprises a chelating agent selected from the group consisting of: iminodiacetic acid, lauryl ethylenediamine triacetic acid, 2,4-pentanedione, 1,1,1-trifluoro-2,4-pentanedione, 1,1,1,5,5,5-hexafluoro-2,4-pentanedione, substituted dithiocarbamates, malonic acid esters, and polyethylene glycols.

7. The cleaning composition of claim 1, further comprising an acid.

8. The cleaning composition of claim 7, wherein said acid is selected from the group consisting of: carboxylic acids, perfluorocarboxylic acids, alkyl sulfonic acids, and aryl sulfonic acids.

9. The cleaning composition of claim 1, further comprising a reducing agent.

10. The cleaning composition of claim 9, wherein the reducing agent comprises an agent selected from the group consisting of hydrogen, xylenes, ammonia, silanes, hydrides and alkyl substituted hydrazines.

11. The cleaning composition of claim 9, wherein the reducing agent is activated by a modality selected from the group consisting of thermal activation, optical activation, sonic activation, and ultrasonic activation.

12. The cleaning composition of claim 1, further comprising an active agent for chemical reaction.

13. The cleaning composition of claim 12, wherein the active agent comprises at least one material selected from the group consisting of acids, bases, reducing agents and oxidizing agents.

14. The cleaning composition of claim 1, wherein the organic co-solvent comprises a single co-solvent species.

15. The cleaning composition of claim 1, wherein the organic co-solvent comprises multiple co-solvent species.

16. A cleaning composition comprising supercritical fluid and xylene, wherein said cleaning composition is useful for removing unwanted solder flux residue material and surface films from integrated circuitry structures and solder preforms having such unwanted material thereon.

17. The cleaning composition of claim 16, wherein xylene is present in said cleaning composition at concentration of up to about 5 percent by volume, based on the total volume of the supercritical fluid and xylene.

18. The cleaning composition of claim 1, wherein the organic co-solvent is present in said cleaning composition at concentration in a range of from about 0.1 to about 25 percent by volume, based on the total volume of the composition.

19. The cleaning composition of claim 1, wherein the organic co-solvent is present in said cleaning composition at concentration in a range of from about 0.1 to about 15 percent by volume, based on the total volume of the composition.

20. A cleaning composition comprising a supercritical fluid, at least one β-diketone, a co-solvent and boric acid.

21. The cleaning composition of claim 20, wherein the supercritical fluid comprises a fluid selected from the group consisting of: carbon dioxide, oxygen, argon, xenon, ammonia, and mixtures thereof.

22. The cleaning composition of claim 20, wherein the supercritical fluid comprises carbon dioxide.

23. The cleaning composition of claim 20, wherein the at least one β-diketone comprises a β-diketone selected from the group consisting of:
   2,2,6,6-tetramethyl-3,5-heptanedione;
   1,1,1-trifluoro-2,4-pentanedione;
   1,1,1,5,5,5-hexafluoro-2,4-pentanedione;
   6,6,7,7,8,8,8-heptafluoro-2,2-dimethyl-3,5-octanedione;
   2,2,7-trimethyl-3,5-octanedione;
   1,1,1,5,5,6,6,7,7,7-decafluoro-2,4-heptanedione; and
   1,1,1-trifluoro-6-methyl-2,4-heptanedione.

24. The cleaning composition of claim 20, wherein the co-solvent is organic or non-organic.

25. The cleaning composition of claim 20, further comprising a surfactant or fluoro surfactant.

26. The cleaning composition of claim 20, further comprising an active agent.

27. The cleaning composition of claim 20, further comprising an acid.

28. The cleaning composition of claim 20, further comprising a base.

29. The cleaning composition of claim 20, further comprising a reducing agent.

30. The cleaning composition of claim 20, further comprising an oxidizing agent.

31. The cleaning composition of claim 20, wherein the at least one β-diketone is present in the composition at concentration in a range of from about 0.1 to about 20 percent by volume, based on the total volume of the composition.

32. The cleaning composition of claim 20, wherein the at least one β-diketone is present in the composition at concentration in a range of from about 0.1 to about 12 percent by volume, based on the total volume of the composition.

33. The cleaning composition of claim 20, wherein the supercritical fluid comprises SCCO2 and the at least one β-diketone comprises 1,1,1-trifluoroacetylacetone or 1,1,1,5,5,5-hexafluoroacetylacetone.

34. A method of removing unwanted material from integrated circuitry structures and solder preforms having such unwanted material thereon, said method comprising contacting said unwanted material with a cleaning formulation for sufficient time to at least partially remove said unwanted material wherein said cleaning formulation comprises supercritical carbon dioxide, an organic co-solvent, and boric acid, wherein said organic co-solvent comprises a solvent selected from the group consisting of: xylene, N-methylpyrrolidone, N-phenylpyrrolidone, dimethylsulfoxide, sulfolane, catechol, ethyl lactate, acetone, methyl ethyl ketone, monoethanolamine, butyrol lactone, diglycol amine, γ-butyrolactone, butylene carbonate, ethylene carbonate, propylene carbonate, beta-diketone, and combinations thereof.

35. The method of claim 34, wherein said organic co-solvent may include inorganic or organic additives selected from the group consisting of ammonium fluoride, alkyl ammonium fluoride derivatives of $NR_4F$, where each R is independently selected from hydrogen and $C_1$-$C_8$ alkyl, $CF_3SO_3F$, and aryl sulfonic acids.

36. The method of claim 34, wherein the cleaning composition further comprises at least one surfactant.

37. The method of claim 36, wherein the at least one surfactant comprises a surfactant selected from the group consisting of: 3,4-dimethyl-1-hexyn-3-ol, 2,4,7,9-tetramethyl-5-decyn-4,7-diol, and fluorinated surfactants.

38. The method of claim 34, wherein the cleaning composition further comprises at least one chelating agent.

39. The method of claim 38, wherein the at least one chelating agent comprises a chelating agent selected from the group consisting of: iminodiacetic acid, lauryl ethylenediamine triacetic acid, 2,4-pentanedione, 1,1,1-trifluoro-2,4-pentanedione, 1,1,1,5,5,5-hexafluoro-2,4-pentanedione, substituted dithiocarbamates, malonic acid esters, and polyethylene glycols.

40. The method of claim 34, wherein the cleaning composition further comprises an acid.

41. The method of claim 40, wherein said acid is selected from the group consisting of: carboxylic acids, perfluorocarboxylic acids, alkyl sulfonic acids, and aryl sulfonic acids.

42. The method of claim 34, wherein the cleaning composition further comprises a reducing agent.

43. The method of claim 42, wherein the reducing agent comprises an agent selected from the group consisting of hydrogen, xylenes, ammonia, silanes, hydrides and alkyl substituted hydrazines.

44. The method of claim 42, wherein the reducing agent is activated by a modality selected from the group consisting of thermal activation, optical activation, sonic activation and ultrasonic activation.

45. The method of claim 34, wherein the cleaning composition further comprises an active agent.

46. The method of claim 45, wherein the active agent comprises at least one material selected from the group consisting of acids, bases, reducing agents and oxidizing agents.

47. The method of claim 34, wherein the organic co-solvent comprises a single co-solvent species.

48. The method of claim 34, wherein the organic co-solvent comprises multiple co-solvent species.

49. A method of removing unwanted solder flux residue material and surface films from integrated circuitry structures and solder preforms having such unwanted material thereon, said method comprising contacting said unwanted material with a cleaning formulation for sufficient time to at least partially remove said unwanted material and wherein said cleaning formulation comprises supercritical fluid and xylene.

50. The method of claim 49, wherein xylene is present in said cleaning composition at concentration of up to about 5 percent by volume, based on the total volume of the supercritical fluid and xylene.

51. The method of claim 34, wherein the organic co-solvent is present in said cleaning composition at concentration in a range of from about 0.1 to about 25 percent by volume, based on the total volume of the composition.

52. The method of claim 34, wherein the organic co-solvent is present in said cleaning composition at concentration in a range of from about 0.1 to about 15 percent by volume, based on the total volume of the composition.

53. A method of making a packaged integrated circuit (IC) product, comprising fabricating an IC chip, affixing the IC chip to packaging structure with an array of solder preform balls in contact with a flux, applying heat to the array of solder perform balls to effect solder bonding of the IC chip to the packaging structure, and cleaning solder-bonded regions by contacting same with a cleaning composition comprising supercritical fluid and xylene.

54. The method of claim 53, wherein the xylene is present in said cleaning composition at concentration of up to about 5 percent by volume, based on the total volume of the supercritical fluid and xylene.

55. A method of cleaning a semiconductor substrate for removal of unwanted material thereon, wherein said unwanted material comprises material selected from the group consisting of metals, metal oxides, metal-containing post-etch residues, and CMP particles, said method comprising contacting the semiconductor substrate with a cleaning composition for sufficient time to at least partially remove said unwanted material from said semiconductor substrate, wherein said cleaning composition comprises a supercritical fluid, a co-solvent, boric acid, and at least one β-diketone.

56. The method of claim 55, wherein the supercritical fluid comprises a fluid selected from the group consisting of: carbon dioxide, oxygen, argon, xenon, ammonia, and mixtures thereof.

57. The method of claim 55, wherein the supercritical fluid comprises carbon dioxide.

58. The method of claim 55, wherein the at least one β-diketone comprises a β-diketone selected from the group consisting of:

2,2,6,6-tetramethyl-3,5-heptanedione;

1,1,1-trifluoro-2,4-pentanedione;

1,1,1,5,5,5-hexafluoro-2,4-pentanedione;

6,6,7,7,8,8,8-heptafluoro-2,2-dimethyl-3,5-octanedione;

2,2,7-trimethyl-3,5-octanedione;

1,1,1,5,5,6,6,7,7,7-decafluoro-2,4-heptanedione; and 1,1,1-trifluoro-6-methyl-2,4-heptanedione.

59. The method of claim 55, wherein the cleaning composition further comprises a surfactant or a fluoro surfactant.

60. The method of claim 55, wherein the cleaning composition further comprises an active agent.

61. The method of claim 55, wherein the cleaning composition further comprises an acid.

62. The method of claim 55, wherein the cleaning composition further comprises a base.

63. The method of claim 55, wherein the cleaning composition further comprises a reducing agent.

64. The method of claim 55, wherein the cleaning composition further comprises an oxidizing agent.

65. The method of claim 55, wherein the at least one β-diketone is present in the composition at concentration in a range of from about 0.1 to about 20 percent by volume, based on the total volume of the composition.

66. The method of claim 55, wherein the at least one β-diketone is present in the composition at concentration in a range of from about 0.1 to about 12 percent by volume, based on the total volume of the composition.

67. The method of claim 55, wherein the supercritical fluid comprises SCCO2 and the at least one β-diketone comprises 1,1,1-trifluoroacetylacetone or 1,1,1,5,5,5-hexafluoroacetylacetone.

68. A cleaning composition consisting of supercritical carbon dioxide, an organic co-solvent, and boric acid.

* * * * *